(12) United States Patent
Chen

(10) Patent No.: US 10,817,075 B2
(45) Date of Patent: Oct. 27, 2020

(54) KEYBOARD CONTROL SYSTEM AND COMPUTER INPUT SYSTEM ALLOWING A SINGLE PIN TO CORRESPOND TO A SINGLE KEY WHEN PRESSED ON THE KEYBOARD KEY

(71) Applicant: Chicony Electronics Co., Ltd., New Taipei (TW)

(72) Inventor: Chien-Tsung Chen, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 0 days.

(21) Appl. No.: 16/004,193

(22) Filed: Jun. 8, 2018

(65) Prior Publication Data

US 2019/0196604 A1    Jun. 27, 2019

Related U.S. Application Data

(60) Provisional application No. 62/610,413, filed on Dec. 26, 2017.

(51) Int. Cl.
*G06F 3/023* (2006.01)
*G06F 1/22* (2006.01)
*G06F 3/02* (2006.01)

(52) U.S. Cl.
CPC ............ *G06F 3/023* (2013.01); *G06F 3/0202* (2013.01)

(58) Field of Classification Search
CPC ......... G05B 15/02; G06F 3/0202; G06F 3/02; G06F 3/021; G06F 3/0219
See application file for complete search history.

(56) References Cited

U.S. PATENT DOCUMENTS

| 5,856,794 A | * | 1/1999 | Chang | H03M 11/20 340/14.1 |
| 2002/0167494 A1 | * | 11/2002 | Sherman | G06F 3/0202 345/168 |
| 2004/0233624 A1 | | 11/2004 | Aisenberg | |
| 2006/0066577 A1 | * | 3/2006 | Barthelet | H03M 11/20 345/168 |
| 2007/0247339 A1 | * | 10/2007 | Lu | H03M 11/003 341/26 |
| 2008/0224638 A1 | * | 9/2008 | Cheng | H05B 33/0803 315/349 |

(Continued)

FOREIGN PATENT DOCUMENTS

| CN | 104503599 B | * 12/2017 | ............. G06F 3/023 |
| TW | 324829 B | 1/1998 | |

*Primary Examiner* — Jennifer Mehmood
*Assistant Examiner* — James S Nokham
(74) *Attorney, Agent, or Firm* — Muncy, Geissler, Olds & Lowe, P.C.

(57) ABSTRACT

A keyboard control system and a computer input system thereof are disclosed. The keyboard control system is used in a keyboard of the computer input system, wherein the keyboard has a plurality of keys. The keyboard control system includes a plurality of key control modules and a main control module. Each key control module is electrically connected to a plurality of keys so as to generate a key control signal according to the actuation of any one of the keys, wherein each key control module is electrically connected to different keys. The main control module is electrically connected to a plurality of key control modules for executing the key control signal.

8 Claims, 4 Drawing Sheets

(56) References Cited

U.S. PATENT DOCUMENTS

| | | | |
|---|---|---|---|
| 2009/0096640 A1* | 4/2009 | Sherman | H03M 11/003 341/24 |
| 2009/0147959 A1* | 6/2009 | Chen | G06F 1/22 380/277 |
| 2009/0188378 A1 | 7/2009 | Folkesson | |
| 2009/0248925 A1* | 10/2009 | Guan | G06F 3/0202 710/67 |
| 2010/0066567 A1 | 3/2010 | Dietz et al. | |
| 2013/0060976 A1* | 3/2013 | Chao | H03M 11/003 710/67 |
| 2015/0057772 A1* | 2/2015 | Hsu | G05B 15/02 700/84 |

\* cited by examiner ics KEYBOARD CONTROL SYSTEM AND
COMPUTER INPUT SYSTEM ALLOWING A
SINGLE PIN TO CORRESPOND TO A
SINGLE KEY WHEN PRESSED ON THE
KEYBOARD KEY

BACKGROUND OF THE INVENTION

1. Field of the Invention

The present invention relates to a keyboard control system and a computer input system thereof, particularly to a keyboard control system allowing a single pin to correspond to a single key, and a computer input system thereof.

2. Description of the Related Art

With the progress of time, it is common for people to use a keyboard to enter text or control signals. To generate a variety of control signals, in the prior art, some techniques involve inputting combinations of keys by simultaneously pressing different keys, especially in the manipulation of a game. Entering key combinations directly is an indispensable technique.

Hereafter, please refer to FIG. 1, which is an architecture diagram of a keyboard control system in the prior art.

In a keyboard control system 90 in the prior art, a keyboard is controlled in a manner that keyboard keys are arranged in a matrix form, such as the keyboard matrix 91 shown in FIG. 1. When the key is pressed, a main control module 94 queries the keyboard code table according to the information of the column keyboard controller 92 and the row keyboard controller 93 to determine the key information pressed by the user and output it. However, the design of this matrix means that pressing will form a pathway. If too many keys are pressed simultaneously, the signal may be misjudged due to a key mapping conflict (or called ghost key).

To prevent key mapping conflicts, specially designed circuits or control methods have been applied in the prior art. For example, the keyboard matrix 91 in the prior art may be connected to a diode series switch. The principle is that when three keys with a right-angled triangle are pressed at the same time, a diode is used to block the reverse feedback current of the three keys from being short-circuited with a fourth key that is quadrangular with the three keys; thus, it will not be misjudged if the fourth key is not pressed. However, each key must be connected in series with a diode in this method. Generally, the diodes are embedded in a membrane, which often causes poor embedding, or the diodes are soldered to a large area of PCBA, resulting in increased costs.

Additionally, Taiwan Patent No. 324829 "Key Switch" has disclosed that each key is isolated from the others. Whenever a key is pressed, the circuit senses a small amount of current change and then determines if a key is pressed through an amplifier and a latch circuit. However, due to the small amount of current change induced, if the amplifier circuit is poor (the number of times is too small or there is noise), the occurrence of key misjudgment often occurs. Besides the high cost, the manufacturing process is not simple.

Furthermore, US Patent No. US2010/0066567A1 "Resistive switch matrix" discloses that each key is connected in series with one resistor and that one row is scanned at a time. If a key in the row is pressed, the resistance of the key will be connected to the power supply, and the other rows that are not scanned will be connected in parallel with the bypass resistor to form a small resistance and be connected to the ground terminal. Therefore, a two-series component voltage divided value can be obtained, and then this value can be used with the comparator circuit to determine if a key is pressed. However, this technique requires the printing of a secondary ink on a membrane, one for low-resistance ink printing and the other for high impedance ink printing. Therefore, errors due to the differences in the impedance of the two different inks may cause the problem of poor yields.

Furthermore, to prevent the stray capacitance charge/discharge time in the keyboard matrix 91 from causing incorrect judgment of the voltage determining whether or not the key is pressed, it is possible to increase the delay time by about 30 ms, or to increase the delay for a longer time, when each column keyboard controller 92 scans. The Row× Column matrix of a general gaming keyboard is approximately 8×16, so the main control module 94 wastes at least 30 μs×16 of the charge/discharge time, i.e., 480 μs. To enhance the key response time, a general gaming keyboard usually scans the entire keyboard matrix 91 once every millisecond (ms). This scan rate will cause the main control module 94 to waste about 48% of the charge-discharge time delay (480 μs divided by 1 ms).

Accordingly, it is necessary to invent a new keyboard control system and computer input system to overcome the shortcoming in the prior art.

SUMMARY OF THE INVENTION

It is a major objective of the present invention to provide a keyboard control system which has the effect of allowing a single pin to correspond to a single key, and a computer input system thereof.

It is another objective of the present invention to provide a computer input system having the keyboard control system described above.

To achieve the above objectives, the keyboard control system of the present invention is used in a keyboard of a computer input system. The keyboard has a plurality of keys. The keyboard control system includes a plurality of key control modules and a main control module. Each of the key control modules is electrically connected to the plurality of keys so as to generate a key control signal according to the actuation of any one of the keys, wherein each said key control module is electrically connected to different keys. The main control module is electrically connected to the plurality of key control modules for executing the key control signal.

The computer input system of the present invention includes a keyboard and a keyboard control system. The keyboard has a plurality of keys. The keyboard control system includes a plurality of key control modules and a main control module. Each said key control module is electrically connected to the plurality of keys so as to generate a key control signal according to the actuation of any one of the keys, wherein each said key control module is electrically connected to different keys. The main control module is electrically connected to the plurality of key control modules for executing the key control signal.

DETAILED DESCRIPTION OF THE PREFERRED EMBODIMENT

Hereafter, the technical content of the present invention will be better understood with reference to preferred embodiments.

Figure 1:
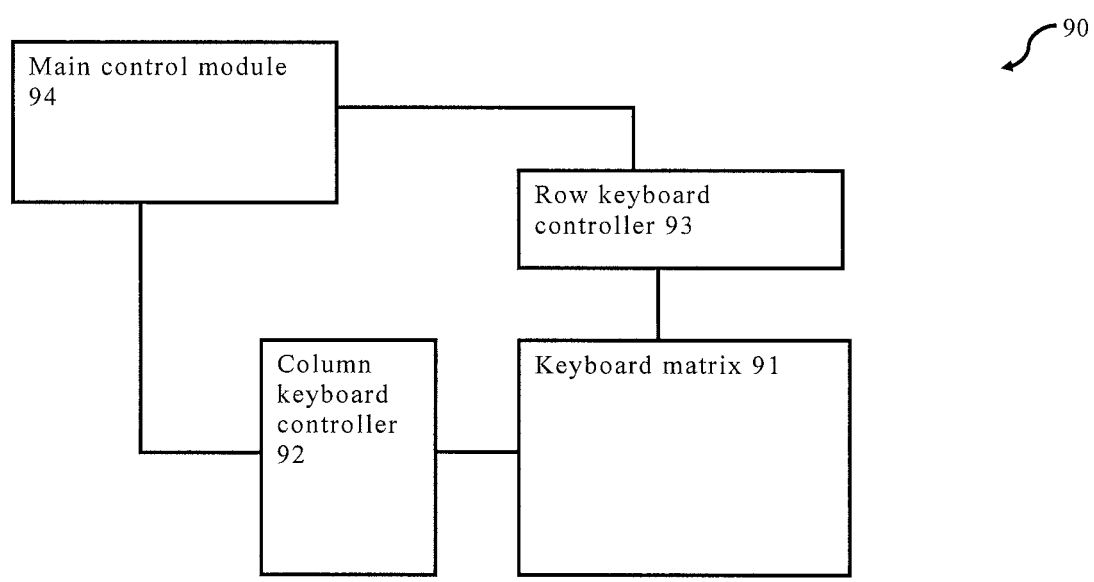
FIG. 1 is an architecture diagram of a keyboard control system in the prior art.
Figure 2:
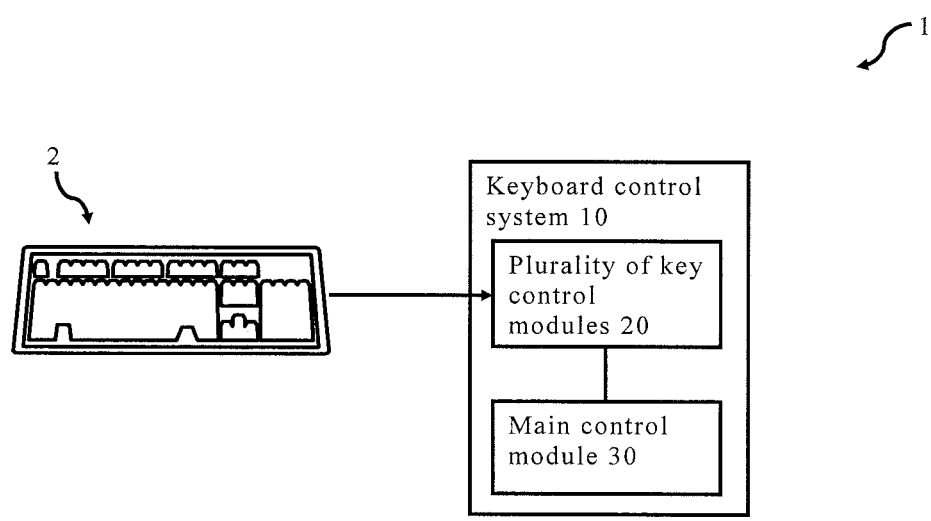
FIG. 2 is an architecture diagram of a computer input system of the present invention.

Hereafter, please first refer to FIG. 2, which is an architecture diagram of a computer input system of the present invention.

Figure 3:
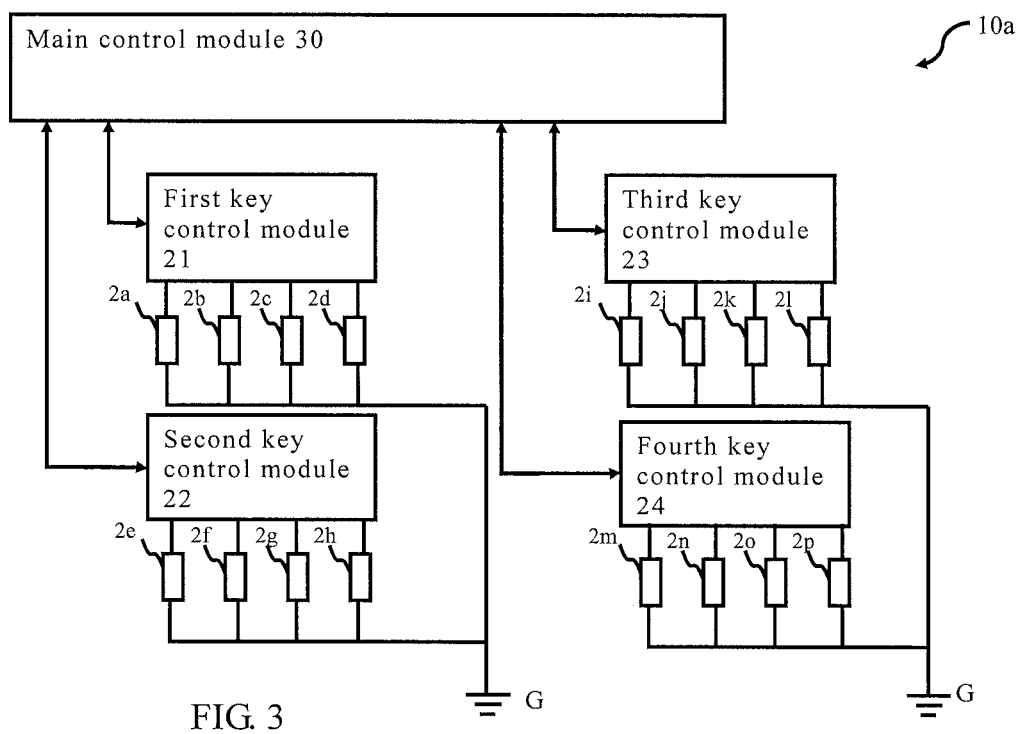
FIG. 3 is an architecture diagram of a keyboard control system in a first embodiment of the present invention.
Figure 4:
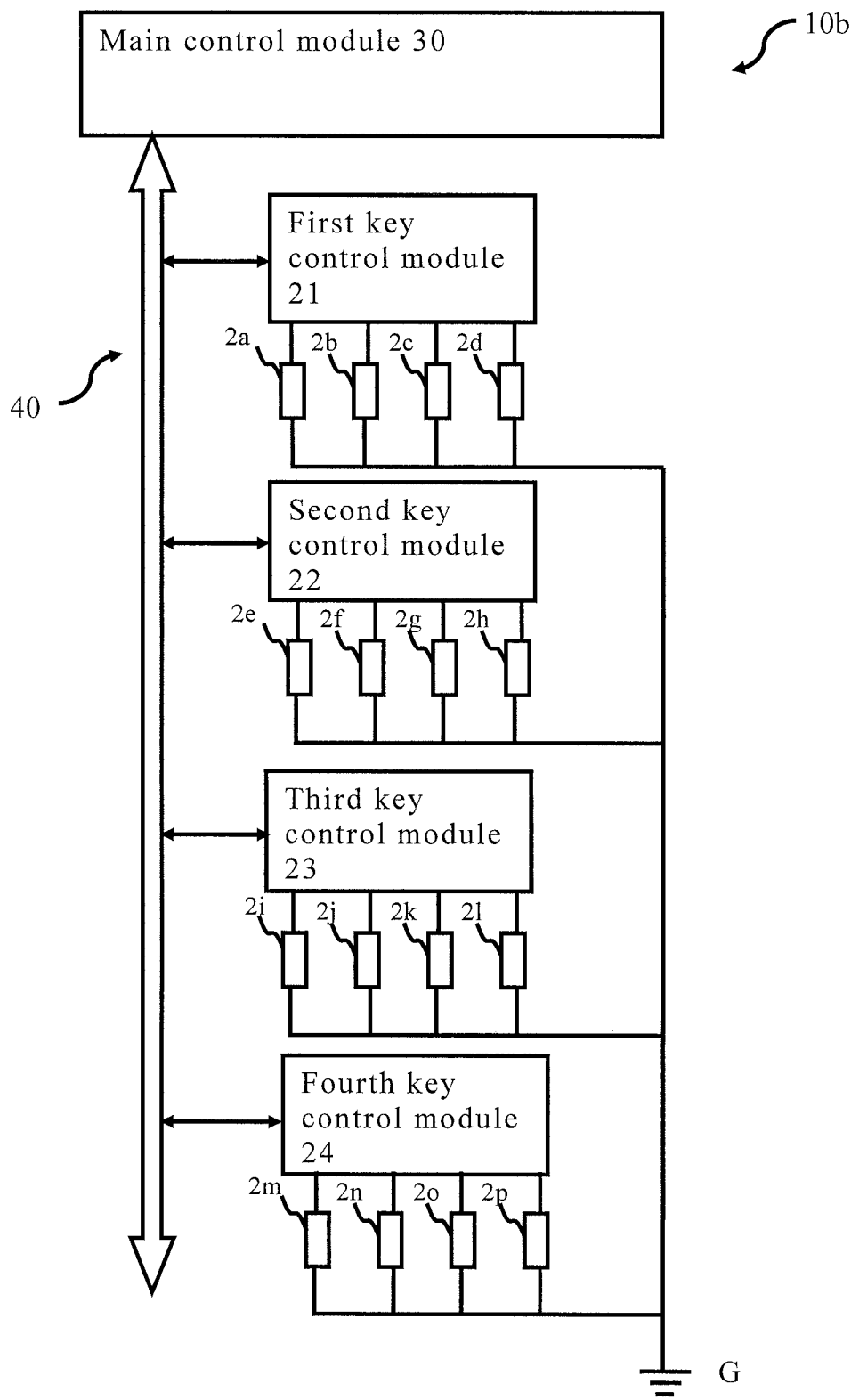
FIG. 4 is an architecture diagram of a keyboard control system in a second embodiment of the present invention.

A computer input system 1 of the present invention can be applied to a host computer such as a desktop or notebook computer to input control commands, but the present invention is not limited thereto. The computer input system 1 includes a keyboard 2 and a keyboard control system 10. The keyboard 2 has a plurality of keys for users to press, such as the keys 2a to 2p shown in FIG. 3 or FIG. 4, but FIG. 3 or FIG. 4 is merely illustrative, and the present invention does not limit the number of keys. The keyboard control system 10 includes a plurality of key control modules 20 and a main control module 30. The plurality of key control modules 20 are electrically connected to each key on the keyboard 2, and then the main control module 30 is electrically connected to the plurality of key control modules 20 for receiving a key control signal after pressing a key. Finally, the key control signal can be used to control the other modules (not shown) to which the computer input system 1 is electrically connected. Since this part is not the focus of the present invention, it will not be repeated herein.

Hereafter, please refer to FIG. 3, which is an architecture diagram of a keyboard control system in a first embodiment of the present invention.

In the first embodiment of the present invention, the keyboard control system 10a may include a first key control module 21, a second key control module 22, a third key control module 23, and a fourth key control module 24, but the present invention is not limited to that number. The pin of the first key control module 21 is electrically connected to keys 2a to 2d, the pin of the second key control module 22 is electrically connected to keys 2e to 2h, the pin of the third key control module 23 is electrically connected to keys 2i to 2l, and the pin of the fourth key control module 24 is electrically connected to keys 2m to 2p. Each of the keys 2a to 2p can be further electrically connected to a ground terminal G. It can be seen that the first key control module 21 to the fourth key control module 24 are electrically connected to different keys 2a to 2p, and each of the keys 2a to 2p is independently electrically connected to one of the pins of the key control module. It should be noted that the number of keys in FIG. 3 is merely illustrative. For application in a commercially available keyboard 2, each key control module can have 32 pins to directly and electrically connect with 32 keys. In this way, the four key control modules can correspond to 128 keys, which is in line with the general requirements of the keyboard 2.

When any one of the keys 2a to 2p is pressed, the corresponding key control modules 21 to 24 will generate a key control signal. The key control signal will be transmitted to the main control module 30 to control other modules to which the computer input system 1 is electrically connected. Since each key 2a to 2p is independently electrically connected to one of the key control modules 21 to 24, the generated key control signal is independent, and there will be no key control signal error if the keys 2a to 2p are not pressed. This can avoid the phenomenon of key mapping conflicts or ghost keys. Furthermore, the main control module 30 does not need to scan the entire keyboard matrix and does not need to wait for charging/discharging delay times of all the column keyboard controllers as described in the prior art. Therefore, it can greatly save the processing time of the main control module 30.

Now please refer to FIG. 4, which is an architecture diagram of a keyboard control system in a second embodiment of the present invention.

In the second embodiment of the present invention, the first key control module 21, the second key control module 22, the third key control module 23, and the fourth key control module 24 of the keyboard control system 10b are all electrically connected to the main bus 40, and the main bus 40 is electrically connected to the main control module 30. In other words, the present invention does not limit the path or method of the first key control module 21, the second key control module 22, the third key control module 23, and the fourth key control module 24 electrically connected to the main control module 30 by techniques such as UART (Universal Asynchronous Receiver/Transmitter), SPI (Serial Peripheral Interface Bus) or I$^2$C (Inter-Integrated Circuit). The first key control module 21, the second key control module 22, the third key control module 23, and the fourth key control module 24 may also be connected to each other in series or in parallel.

It should be noted that each of the modules included in the computer input system 1 or the keyboard control system 10 may be a hardware device, a software program in combination with a hardware device, a firmware in combination with a hardware device, and the like, but the present invention is not limited in the above manner. In addition, the preferred embodiments of the present invention described above are only illustrative. To avoid redundancy, not all of the possible combinations are documented in detail. However, it shall be understood by those skilled in the art that each of the modules or elements described above may not be necessary. For the implementation of the present invention, the present invention may also contain other detailed, conventional modules or elements. Each module or component is likely to be omitted or modified depending on varying needs. Other modules or elements may not necessarily exist between any two of the modules.

It can be seen that the keyboard control system 10, 10a, 10b of the present invention allows each of the keys 2a to 2p to be independently electrically connected to one of the key control modules 21 to 24 so as to avoid the phenomenon of key mapping conflicts or ghost keys. In addition, this can also achieve the advantages of easy circuit layout, cost savings, convenient control and improved performance.

It should be noted that the preferred embodiments of the present invention described above are merely illustrative. To avoid redundancy, not all of the possible combinations are documented in detail. However, it shall be understood by those skilled in the art that each of the modules or elements described above may not be necessary. For the implementation of the present invention, the present invention may also contain other detailed, conventional modules or elements. Each module or component is likely to be omitted or modified depending on varying needs. Other modules or elements may not necessarily exist between any two modules. Such modifications can be performed without departing from the scope of the invention as defined solely by the appended claims.

What is claimed is:

1. A keyboard control system, which is used in a keyboard of a computer input system, the keyboard having a plurality of keys, the keyboard control system comprising:
    a plurality of key control modules, each of which comprising a plurality of pins and connecting to the plurality of keys;
    each of the plurality of keys is electrically connected to one of the plurality of pins respectively so as to generate a key control signal according to the actuation of any one of the keys, wherein each said key control module is electrically connected to different plural keys, thus each of the keys is independently and directly electrically connected to one of the pins of the key control module; and
    a main control module, which is electrically connected to the plurality of key control modules for executing the key control signal.

2. The keyboard control system as claimed in claim 1, comprising a first key control module, a second key control module, a third key control module, and a fourth key control module, wherein each said key control module is electrically connected to different keys.

3. The keyboard control system as claimed in claim 2, wherein each of the key control modules has 32 pins electrically connected to 32 keys.

4. The keyboard control system as claimed in claim 1, wherein each of the key control modules is electrically connected to the main control module via a main bus.

5. A computer input system, comprising:
    a keyboard, which has a plurality of keys; and
    a keyboard control system, comprising:
    a plurality of key control modules, each of which comprising a plurality of pins and connecting to the plurality of keys;
    each of the plurality of keys is electrically connected to one of the plurality of pins respectively so as to generate a key control signal according to the actuation of any one of the keys, wherein each said key control module is electrically connected to different plural keys, thus each of the keys is independently and directly electrically connected to one of the pins of the key control module; and
    a main control module, which is electrically connected to the plurality of key control modules for executing the key control signal.

6. The computer input system as claimed in claim 5, comprising a first key control module, a second key control module, a third key control module, and a fourth key control module, wherein each said key control module is electrically connected to different keys.

7. The computer input system as claimed in claim 6, wherein each of the key control modules has 32 pins electrically connected to 32 keys.

8. The computer input system as claimed in claim 5, wherein each of the key control modules is electrically connected to the main control module via a main bus.

* * * * *